United States Patent
Khan et al.

(10) Patent No.: US 9,431,370 B2
(45) Date of Patent: Aug. 30, 2016

(54) COMPLIANT DIELECTRIC LAYER FOR SEMICONDUCTOR DEVICE

(71) Applicant: Broadcom Corporation, Irvine, CA (US)

(72) Inventors: Rezaur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/147,237

(22) Filed: Jan. 3, 2014

(65) Prior Publication Data

US 2015/0179610 A1 Jun. 25, 2015

Related U.S. Application Data

(60) Provisional application No. 61/918,373, filed on Dec. 19, 2013.

(51) Int. Cl.
| | |
|---|---|
| *H01L 25/065* | (2006.01) |
| *H01L 21/768* | (2006.01) |
| *H01L 23/528* | (2006.01) |
| *H01L 23/498* | (2006.01) |
| *H01L 21/48* | (2006.01) |
| *H01L 23/48* | (2006.01) |

(52) U.S. Cl.
CPC ......... *H01L 25/0655* (2013.01); *H01L 21/486* (2013.01); *H01L 21/4828* (2013.01); *H01L 21/4853* (2013.01); *H01L 21/768* (2013.01); *H01L 23/48* (2013.01); *H01L 23/481* (2013.01); *H01L 23/49827* (2013.01); *H01L 23/49838* (2013.01); *H01L 23/528* (2013.01); *H01L 2224/13* (2013.01); *H01L 2224/73204* (2013.01)

(58) Field of Classification Search
CPC . H01L 25/065; H01L 21/768; H01L 23/528; H01L 23/498; H01L 21/48
USPC .............. 257/692, 777, 211, 619, 700, 723; 438/584
See application file for complete search history.

(56) References Cited

U.S. PATENT DOCUMENTS

6,317,333 B1 * 11/2001 Baba .............................. 361/795
6,365,975 B1 * 4/2002 DiStefano et al. ........... 257/777

(Continued)

FOREIGN PATENT DOCUMENTS

| | | |
|---|---|---|
| EP | 1739739 A1 | 1/2007 |
| JP | 2013197470 A | 9/2013 |

OTHER PUBLICATIONS

European Search Report received for European Application No. 14004185.6, dated Oct. 26, 2015, 4 pages.

*Primary Examiner* — Sheng Zhu

(57) ABSTRACT

Systems, apparatuses, and methods provided for semiconductor devices and integrated circuit (IC) packages that include compliant dielectric layers. In a through silicon via interposer or substrate, a compliant dielectric material may be added to a surface of silicon material body to form a compliant dielectric layer. The compliant dielectric layer provides a thermal buffer and a stress buffer for a resulting IC package. The compliant dielectric material may be selected such that the coefficient of thermal expansion of the compliant dielectric material approximately matches the coefficient of thermal expansion of the circuit board on which the IC package is mounted. The compliant dielectric material may be selected such that it has a deformability that is greater than the silicon material body. Multiple sub-layers of compliant dielectric material may be used.

20 Claims, 11 Drawing Sheets

(56) References Cited

U.S. PATENT DOCUMENTS

| | | | |
|---|---|---|---|
| 7,026,833 B2* | 4/2006 | Rincon et al. | 324/754.18 |
| 7,276,799 B2* | 10/2007 | Lee et al. | 257/777 |
| 8,298,944 B1 | 10/2012 | West | |
| 2007/0158787 A1* | 7/2007 | Chanchani | 257/619 |
| 2011/0000706 A1* | 1/2011 | Shomura et al. | 174/262 |
| 2011/0210444 A1 | 9/2011 | Jeng et al. | |
| 2013/0241057 A1 | 9/2013 | Yu et al. | |

* cited by examiner

```
                                    ┌─202
Apply a compliant dielectric material to a surface of a semiconductor material body of
a semiconductor device to surround a through silicon via pillar to form a compliant
                          dielectric material layer ┌─204
Form an interconnect member at a bottom layer of the semiconductor device to be
               coupled to a substrate or printed circuit board
```

COMPLIANT DIELECTRIC LAYER FOR SEMICONDUCTOR DEVICE

CROSS-REFERENCE TO RELATED APPLICATIONS

This application claims priority to U.S. Provisional Patent Application No. 61/918,373, filed Dec. 19, 2013, and entitled "Compliant Dielectric Layer for Semiconductor Device," the entirety of which is incorporated by reference herein.

BACKGROUND

1. Technical Field

The subject matter described herein relates to systems, apparatuses, and methods for compliant dielectric layers for semiconductor devices.

2. Background Art

An integrated circuit (IC) is a common element of electronic devices. An IC typically includes a die (or chip), upon which electrical circuits are formed, and a package that houses the die. Various types of IC packages currently exist. For instance, wafer level packages exist that are basically dies cut from wafers that have interconnects (e.g., solder bumps) mounted directly thereto. The solder bumps are spaced out on the dies by redistribution layers (RDLs) to enable the solder bumps to be directly mounted. The solder bumps enable the wafer level packages to be mounted to circuit boards and the like. Another type of IC package includes an interposer to which an IC die is mounted. Such a package may be considered another type of wafer level package. The interposer is made of a semiconductor material (e.g., silicon) and includes electrically conductive routing and vias, such as through silicon vias (TSVs), and may be referred to as a through silicon via interposer (TSI). The electrically conductive routing traces and vias of the interposer are used to spread out and route signals of the IC die, which is attached to a first surface of the interposer, to interconnects (e.g., solder bumps) on the second, opposing surface of the interposer. The interconnects are used to mount the interposer-enabled package to a circuit board.

During the manufacturing process, such packages undergo temperature cycles (e.g., heating and cooling), which causes thermal expansion of the semiconductor material of the die in a wafer level package, and of the die and interposer in an interposer-enabled wafer level package. Such expansion, or enlarging of the area of the die or interposer, can cause mechanical stress on the semiconductor material and/or on a passivation layer on the semiconductor material and/or on solder bumps/balls and/or on under bump metallization (UBM) layers (i.e., layers that interface a solder ball/bump with the semiconductor material terminals). This is because the semiconductor material may expand at different rates from other materials, including substrate material of a circuit board to which the package is mounted. This difference in thermal expansion rates (due to differences in values of coefficients of thermal expansion—CTEs) can cause cracking, delamination, circuit damage, etc. Furthermore, the larger the die or interposer, the larger the problem becomes, causing a limitation in sizes of dies and interposers that may be used. For instance, current silicon interposer sizes are limited to approximately 600 mm$^2$ (e.g., 25.5 mm×23.6 mm)

BRIEF SUMMARY

Systems, apparatuses, and methods are described for compliant dielectric layers in semiconductor devices and packages, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. The left-most digit(s) of a reference number identifies the drawing in which the reference number first appears.

DETAILED DESCRIPTION

1. Introduction

Figure 1:
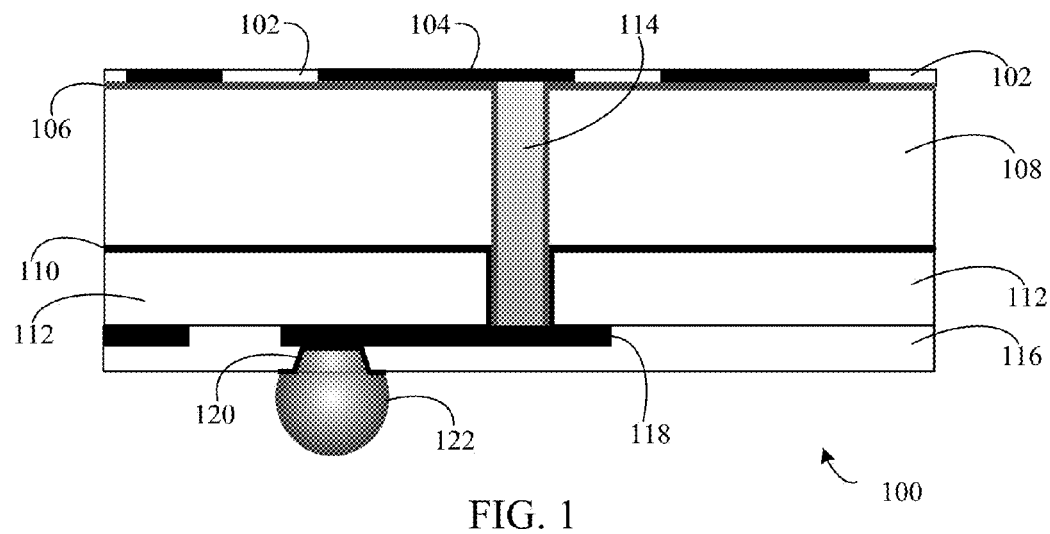
FIG. 1 is a cross-sectional view of a portion of an integrated circuit (IC) package with a compliant dielectric layer, according to an exemplary embodiment.

The present specification discloses numerous example embodiments. The scope of the present patent application is not limited to the disclosed embodiments, but also encompasses combinations of disclosed embodiments, as well as modifications to disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It should be noted that the drawings/figures are not drawn to scale unless otherwise noted herein.

Still further, the terms "coupled" and "connected" may refer to physical, operative, electrical, communicative and/or other connections between components described herein, as would be understood by a person of skill in the relevant art(s) having the benefit of this disclosure.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are now described. Any section/subsection headings provided herein are not intended to be limiting. Embodiments are described throughout this document, and any type of embodiment may be included under any section/subsection. Furthermore, disclosed embodiments may be combined with each other in any manner.

2. Example Embodiments

The embodiments described herein may be adapted to integrated circuit (IC) packaging and to semiconductor devices (e.g., integrated circuit chips and/or dies and semiconductor interposers) which may be used in various types of computing systems, communications systems, communication devices, electronic devices, and/or the like. The described embodiments may refer to particular types of packages and devices, although the inventive techniques provided herein may be applicable to other types of packages and devices not explicitly mentioned. Furthermore, additional structural and operational embodiments, including modifications and/or alterations, will become apparent to persons skilled in the relevant art(s) from the teachings herein.

In embodiments, a layer of a compliant dielectric material (i.e., an organic and/or a non-electrically conductive dielectric material) is added to the surface of an IC die and/or a semiconductor material interposer. Electrically conductive vias are formed through the compliant dielectric material to conduct signals from circuits on the IC die to solder balls/bumps. The solder balls/bumps are configured to electrically and physically connect the IC die and/or the interposer to an organic substrate or printed circuit board (PCB). The compliant dielectric material enables lateral movement and/or compliance during thermal expansion and/or cycling of the die and/or interposer, which reduces or eliminates thermal/mechanical stresses, cracking, detachment, circuit damage, etc., and increases yield, while enabling larger die and interposer sizes (e.g., components with larger areas). In other words, the compliant dielectric material allows portions of the IC package to expand and/or contract with the PCB during thermal variations. Additionally, mechanical shocks (e.g., during drop tests) are reduced as some energy from impact is absorbed by the organic, compliant dielectric material.

A compliant dielectric material may be selected based on a coefficient of thermal expansion (CTE) associated with the compliant dielectric material. In one embodiment, a compliant dielectric material may be selected based, in whole or in part, on it having a CTE that is equal to or approximately equal to a CTE of the organic substrate and/or the PCB. A thickness of a compliant dielectric material applied to an IC package may also be determined based on the CTE of the compliant dielectric material as well as the thermal requirements and/or environment in which the IC package is assembled, tested, and/or operated. In embodiments, the thickness of the compliant dielectric layer may be selected such that the overall backside dielectric layer thickness (including compliant dielectric material) is 10 times greater than conventional backside dielectric layer. For example, a thick compliant dielectric layer may have a thickness between 10-50 μm.

An IC package may be assembled in a manner that utilizes compliant dielectric materials, layers, and/or sub-layers. Suitable organic dielectric materials include, without limitation: elastomers, molding compound, Polyimide, Polybenzoxazole (PBO), benzocyclobutene, polytetrafluoroethylene (PTFE), and/or the like. Multiple layers (e.g., sub-layers) of compliant dielectric material may be used in a single IC package. Such sub-layers may be deposited on top of each other during assembly using the same process and/or mask, or a different process.

The techniques and embodiments described herein provide for improvements in attainable device sizes, device reliability, and device yield, as described above.

For instance, methods, systems, and apparatuses are provided for compliant dielectric layers for semiconductor devices. In an example aspect, a semiconductor device is disclosed that includes a semiconductor material body, a compliant dielectric material layer, a first electrically conductive feature, a second electrically conductive feature, an electrically conductive via, and an interconnect member. The semiconductor material body has opposing first and second surfaces, and includes the first electrically conductive feature at the first surface. The compliant dielectric material layer has opposing first and second surfaces. The first surface of the compliant dielectric material layer is on the second surface of the semiconductor material body, and the compliant dielectric material layer has a deformability that is greater than a deformability of the semiconductor material body. The second electrically conductive feature is formed on the second surface of the compliant dielectric material layer. The electrically conductive via is formed through the semiconductor material body and the compliant dielectric material layer, and electrically couples the first electrically conductive feature to the second electrically conductive feature. The interconnect member is coupled to the second surface of the compliant dielectric material layer and is in electrical contact with the second electrically conductive feature.

In another example aspect, a method is disclosed. The method includes forming an opening in a semiconductor material body having opposing first and second surfaces, the opening formed in the first surface of the semiconductor material body. The method also includes filling the opening with an electrically conductive material, and forming a first electrically conductive feature on the first surface of the semiconductor material body that is electrically coupled to the electrically conductive material in the filled opening. The method further includes applying a support structure to the first surface of the semiconductor material body. The method further includes etching the second surface of the semiconductor material body to expose the filled opening as a pillar extending from the second surface of the semiconductor material body. The method still further includes applying a compliant dielectric material to the etched second surface of the semiconductor material body and surrounding the pillar (e.g., coating/covering the cylindrical outer surface of the pillar) to form a compliant dielectric material layer, the compliant dielectric material layer having opposing first and second surfaces, the first surface of the compliant dielectric material layer adhering to the second surface of the semiconductor material body. Still further, the method includes forming a second electrically conductive feature on the second surface of the compliant dielectric material layer in electrical contact with the pillar at the second surface of the compliant dielectric material layer, the pillar being an electrically conductive via through the semiconductor material body and the compliant dielectric material layer.

In yet another example aspect, an IC package is disclosed that includes a through silicon via interposer having opposing first and second surfaces, and at least one IC die mounted to the first surface of the interposer. The interposer includes a semiconductor material body having opposing first and second surfaces, a compliant dielectric material layer having opposing first and second surfaces, a first electrically conductive via, and a second electrically conductive via. The first surface of the compliant dielectric material layer is on the second surface of the semiconductor material body, and the compliant dielectric material layer has a deformability that is greater than a deformability of the semiconductor material body. The first electrically conductive via and the second electrically conductive via are each formed through the semiconductor material body and the compliant dielectric material layer.

Various example embodiments are described in the following subsections. In particular, example embodiments for semiconductor devices and IC packages with compliant dielectric material layers are described, followed by example embodiments for multi-layer compliant dielectric materials. This is followed by a description of example assembly embodiments. Next, further example embodiments and advantages are described. Finally, some concluding remarks are provided.

3. Example IC Package Embodiments

In embodiments, a semiconductor device is formed that may be included in an integrated circuit (IC) package. The semiconductor device includes one or more through-silicon vias through the semiconductor device to route signals through the semiconductor device. The semiconductor device further includes at least one compliant dielectric layer to provide compliance or "flex" during heating/cooling, which reduces package damage/failures that may otherwise occur due to the resulting expansion or contraction. The semiconductor device may be an interposer incorporated into an IC package and used to route signals from an attached die to solder balls/bumps of the semiconductor device, and/or the semiconductor device may be an IC package in itself by including active integrated circuits in the semiconductor device.

Such a semiconductor device may be configured in various ways to include a compliant dielectric material, in embodiments. For instance, FIG. 1 shows a cross-sectional view of a portion of an exemplary semiconductor device 100 that includes a compliant dielectric layer 112, according to an embodiment. Semiconductor device 100 includes a first dielectric layer 102, a first metal layer 104, a liner layer 106, a silicon layer 108, a passivation layer 110, compliant dielectric layer 112, a through silicon via 114, a second dielectric layer 116, a second metal layer 118, a connector 120, and a solder ball/bump 122. Semiconductor device 100 and each of the components included therein may include functionality and connectivity beyond what is shown in FIG. 1, as would be apparent to persons skilled in relevant art(s). However, such additional functionality is not shown in FIG. 1 for the sake of brevity.

First dielectric layer 102, in embodiments, may be part of a top layer of semiconductor device 100. In some embodiments, first metal layer 104, may also be part of the top layer of semiconductor device 100. In embodiments, first metal layer 104 may include one or more redistribution layers (also referred to as redistribution routing, redistribution interconnects, fan-in or fan-out routing, etc.) for signal routing. First dielectric layer 102 and first metal layer 104 may be formed on a top surface of silicon layer 108 (i.e., a semiconductor material body), as shown in FIG. 1, and liner layer 106 may be formed between silicon layer 108 and first metal layer 104 as well as through silicon via 114. In embodiments, passivation layer 110 may be formed on a bottom surface of silicon layer 108 and through silicon via 114 over liner 106 that is outside of silicon layer 108. In some embodiments, as described in further detail below, passivation layer 110 may be omitted. Passivation layer 110 may be considered a part of silicon layer 108 such that layers and components formed in contact with the bottom surface of passivation layer 110 may be said to be at or on silicon layer 108 and through silicon via 114.

Compliant dielectric layer 112 may include opposing top and bottom surfaces (e.g., first and second surfaces), and may be formed such that the top surface is at or on silicon layer 108 and/or passivation layer 110. Through silicon via 114 is formed through and traverses silicon layer 108, passivation layer 110 (when included, in embodiments), and compliant dielectric layer 112, as shown in FIG. 1. Through silicon via 114 may be formed in a manner as described elsewhere herein (e.g., using a copper fill). A first end of through silicon via 114 is electrically connected to an electrically conductive feature of first metal layer 104. Liner layer 106 is formed on a cylindrical inner surface of silicon via 114 formed through silicon layer 108, passivation layer 110 (when included, in embodiments), and compliant dielectric layer 112.

Second dielectric layer 116 and second metal layer 118 are formed at or on the bottom surface of semiconductor device 100. For instance, second metal layer 118 may be formed on the bottom surface of compliant dielectric layer 112, and second dielectric layer 116 may be formed over second metal layer 118 and also on the bottom surface of compliant dielectric layer 112, as illustrated. In embodiments, second metal layer 118 may be a second redistribution layer for signal routing. A second end of through silicon via 114 is electrically connected to an electrically conductive feature of second metal layer 118.

Connector 120 may be formed in an opening in second dielectric layer 116 and may be in electrical contact with an electrically conductive feature of second metal layer 118 (e.g., an electrically conductive redistribution layer of second metal layer 118). In embodiments, connector 120 may be an under bump metallization (UBM) layer, a ball/bump pad, or other structure configured to interface a solder ball/bump, copper pillar, or other interconnect member with an electrically conductive feature of metal layer 118. A UBM layer is typically one or more metal layers formed (e.g., by metal deposition-sputtering, plating, etc.) to provide a robust interface between an interconnect pad (e.g., of redistribution routing) and a package interconnect mechanism such as a ball/bump interconnect. A UBM layer serves as a solderable layer for mechanical and electrical interconnect mechanism. Furthermore, a UBM provides protection for underlying metal or circuitry from chemical/thermal/electrical interactions between the various metals/alloys used for the package interconnect mechanism. In embodiments, a UBM layer may formed in a similar manner to standard via or routing plating. The different metal layers of the UBM provide corresponding different levels of solderability and protection to provide an overall robust interface.

Solder ball/bump 122 may be formed on, in electrical contact, and/or in physical contact with connector 120. Solder ball/bump 122 is one type of interconnect member, and in embodiments, may be replaced by another form of interconnect member (e.g., a pillar, a land pad, etc.) as would be understood by a person of skill in the relevant art(s) having the benefit of the present disclosure. As described in further detail below, solder ball/bump 122 is configured as an interconnect member to be physically and/or electrically connected to a circuit board such as an organic substrate and/or a printed circuit board (PCB). In embodiments, various properties of compliant dielectric layer 112, such as its coefficient of thermal expansion (CTE), may be approximately equal to the CTE value of the circuit board. As described herein, compliant dielectric layer 112 provides compliance when temperature changes cause silicon layer 108 to change in size (expand or contract) relative to the circuit board, preserving the connection of solder ball/bump 122 between package 100 and the circuit board.

Figure 2:
FIG. 2 is a flowchart providing example steps for assembling a semiconductor device with a compliant dielectric layer, according to an exemplary embodiment.

Semiconductor devices containing compliant dielectric layers and/or materials, such as semiconductor device 100, may be assembled in various ways. For instance, FIG. 2 shows a flowchart 200 providing example steps for assembling an integrated circuit (IC) package with a compliant dielectric layer, according to an example embodiment. Semiconductor device 100 of FIG. 1 and/or any of its components/layers may be assembled in accordance with flowchart 200, in embodiments. Other structural and operational embodiments will be apparent to persons skilled in the relevant art(s) based on the discussion regarding flowchart 200. Flowchart 200 is described as follows.

Flowchart 200 may begin with step 202. In step 202, a compliant dielectric material is applied to a surface of a semiconductor material body of a semiconductor device to surround a through silicon via pillar to form a compliant dielectric material layer. For example, referring to semiconductor device 100 of FIG. 1, compliant dielectric layer 112 may be formed at the bottom surface of silicon layer 108 after etching (described in further detail below). Compliant dielectric layer 112 may be formed around through silicon via 114 such that through silicon via 114 extends through compliant dielectric layer 112. As described above, a first end of silicon via 114 is coupled to a redistribution layer in metal layer 104.

In step 204, an interconnect member is formed at a bottom layer of the semiconductor device to be coupled to a substrate or printed circuit board (PCB). Referring again to semiconductor device 100 of FIG. 1, solder ball/bump 122 (e.g., an interconnect member) is formed at connector 120 at the bottom surface of semiconductor device 100. In the example of FIG. 1, solder ball/bump 122 is coupled to through the second end of silicon via 114 through a redistribution layer of metal layer 118. Solder ball/bump 122 is configured to be physically and/or electrically connected to a circuit board such as a substrate (e.g., an organic substrate) and/or a PCB. In embodiments, the CTE value of the compliant dielectric material applied in step 202 may be approximately equal to the CTE value of the substrate and/or the PCB.

In some embodiments, a compliant dielectric layer may be a single layer of material, while in other embodiments, compliant dielectric layer 112 may include multiple layers. The following section describes examples of multi-layer compliant dielectric layer structures.

4. Example Embodiments for Multi-Layer Compliant Dielectric IC Packages

Figure 3:
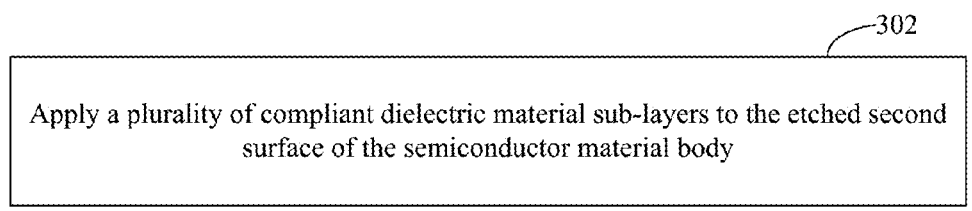
FIGS. 3 and 5 are flowcharts providing example steps for assembling semiconductor devices with compliant dielectric sub-layers, according to an exemplary embodiment.
Figure 4:
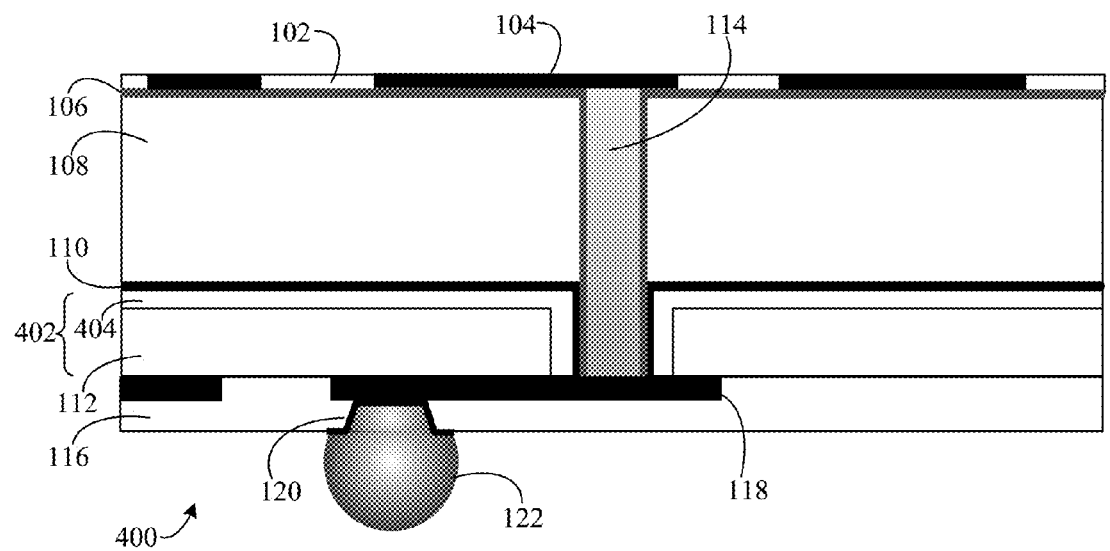
FIGS. 4 and 6-7 are cross-sectional views of portions of semiconductor devices with compliant dielectric sub-layers, according to an exemplary embodiment.

As described in the embodiments herein, integrated circuit (IC) packages may be formed and/or assembled with compliant dielectric layers and materials. In some embodiments, a compliant dielectric layer may include two or more (i.e., a plurality of) sub-layers. For example, FIG. 3 shows a flowchart 300 providing an example step for assembling an integrated circuit (IC) package with compliant dielectric sub-layers. Flowchart 300 is described with respect to FIG. 4 for illustrative purposes. FIG. 4 illustrates a semiconductor device 400 that includes multiple compliant dielectric sub-layers and that may be assembled commensurate with the example step described in flowchart 300 of FIG. 3. Semiconductor device 400 of FIG. 4 may be a further embodiment of semiconductor device 100 shown in FIG. 1 and described above. For instance, semiconductor device 400 is similar to semiconductor device 100, including first dielectric layer 102, first metal layer 104, liner layer 106, silicon layer 108, passivation layer 110, compliant dielectric layer 112, through silicon via 114, second dielectric layer 116, second metal layer 118, connector 120, and solder ball/bump 122. Semiconductor device 400 further includes a plurality of compliant dielectric sub-layers 402 that includes compliant dielectric layer 112 and a second compliant dielectric layer 404.

Flowchart 300 and semiconductor device 400 are described as follows. Other structural and operational embodiments will be apparent to persons skilled in the relevant art(s) based on the discussion regarding flowchart 300 and semiconductor device 400.

Flowchart 300 includes step 302. In step 302, a plurality of compliant dielectric material sub-layers may be applied to the etched second surface of the semiconductor material body. For instance, compliant dielectric sub-layers 402, as sub-layers 402 includes compliant dielectric layer 112 and a second compliant dielectric layer 404. In an embodiment, second compliant dielectric layer 404 may be formed first along the bottom surface of silicon layer 108 and to surround through silicon via 114, and compliant dielectric layer 112 may be formed next at the bottom surface of silicon layer 108 over second compliant dielectric layer 404 (including covering second compliant dielectric layer 404 over the outer cylindrical surface of through silicon via 114).

In some example embodiments, step 302 of flowchart 300 may be performed in addition to or in lieu of steps described in other flowcharts herein. In embodiments, step 302 may be performed in any order or sequence, or partially (or completely) concurrently with other steps described elsewhere herein.

Figure 5:
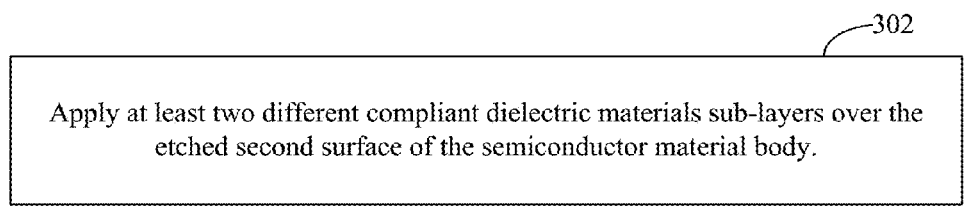
Figure 6:
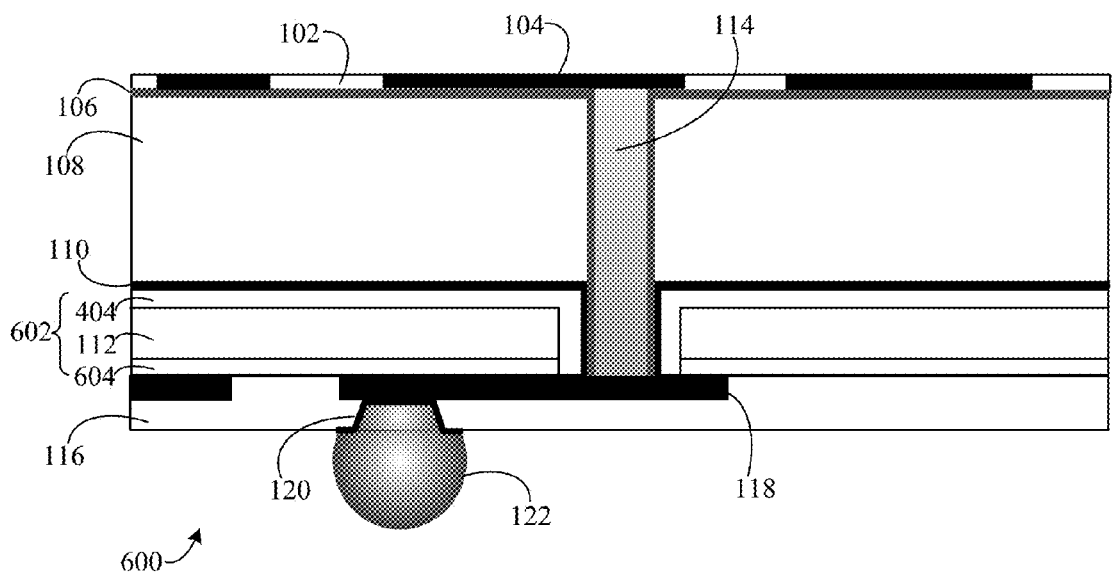

Accordingly, in some embodiments, a compliant dielectric layer may include two or more (i.e., a plurality of) different sub-layers. For example, FIG. 5 is a flowchart providing an example step for assembling an integrated circuit (IC) package with different compliant dielectric sub-layers. FIG. 5 is described with respect to FIG. 6 for illustrative purposes. FIG. 6 illustrates a semiconductor device 600 that includes compliant dielectric sub-layers and that may be assembled commensurate with the example step described in flowchart 500 of FIG. 5. Semiconductor device 600 of FIG. 6 may be a further embodiment of semiconductor device 100 shown in FIG. 1 and/or semiconductor device 400 shown in FIG. 4 (both described above). For instance, semiconductor device 600 includes first dielectric layer 102, first metal layer 104, liner layer 106, silicon layer 108, passivation layer 110, compliant dielectric layer 112, through silicon via 114, second dielectric layer 116, second metal layer 118, connector 120, solder ball/bump 122, and second compliant dielectric layer 404. Semiconductor device 600 also includes a plurality of different compliant dielectric sub-layers 602 that includes compliant dielectric layer 112, second compliant dielectric layer 404, and a third compliant dielectric layer 604. In embodiments, one or more of compliant dielectric layer 112, second compliant dielectric layer 404, and third compliant dielectric layer 604 may be different from the other compliant dielectric layers. For example, all three compliant dielectric layers may be composed of different compliant dielectric materials. In some embodiments, two of the compliant dielectric layers may be composed of the same material, while one of the compliant dielectric layers may be composed of a different material. Furthermore, one or more additional compliant dielectric layers may also be present.

Flowchart 500 and semiconductor device 600 are described as follows. Other structural and operational embodiments will be apparent to persons skilled in the relevant art(s) based on the discussion regarding flowchart 500 and semiconductor device 600.

Flowchart 500 includes step 502. In step 502, at least two different compliant dielectric materials sub-layers are applied over the etched second surface of the semiconductor material body.

For instance, different compliant dielectric sub-layers 602, as shown in FIG. 6, are formed at the bottom surface of silicon layer 108. In an embodiment, second compliant dielectric layer 404 may be formed first along the bottom surface of silicon layer 108 and surrounding through silicon via 114. Compliant dielectric layer 112 may be formed next at the bottom surface of silicon layer 108 over second compliant dielectric layer 404 (including surrounding second compliant dielectric layer 404 formed over through silicon via 114). Third compliant dielectric layer 604 may be formed at the bottom surface of silicon layer 108 over compliant dielectric layer 112 (including surrounding second compliant dielectric layer 404 formed over through silicon via 114).

In some example embodiments, step 502 of flowchart 500 may be performed in addition to or in lieu of steps described in other flowcharts herein. Further, in some example embodiments, step 502 may be performed in any order or sequence, or partially (or completely) concurrently, with other steps described in other flowcharts.

Figure 7:
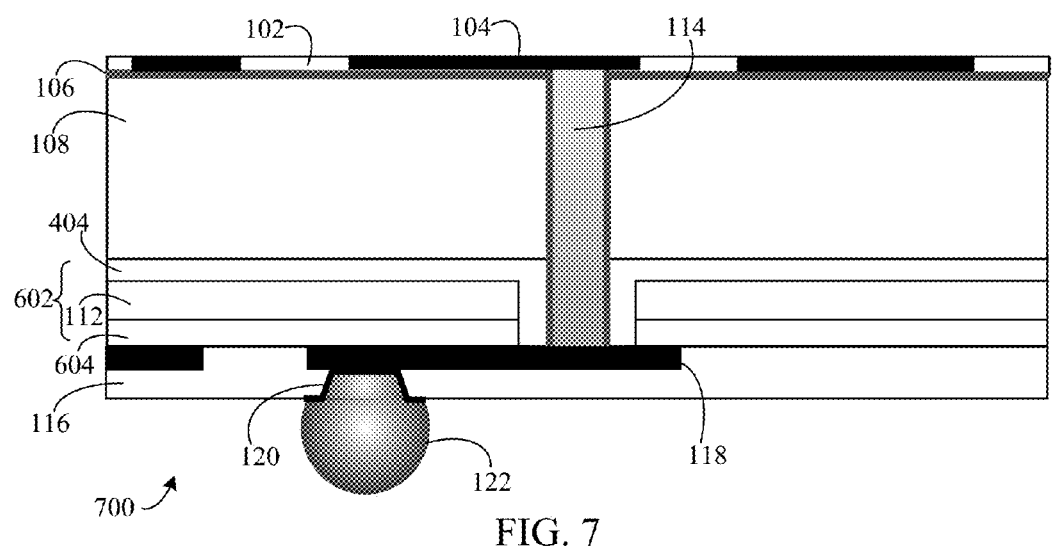

Referring now to FIG. 7, a semiconductor device 700 is shown. Semiconductor device 700 may be a further embodiment of semiconductor device 400 of FIG. 4 and/or of semiconductor device 600 of FIG. 6 (as illustrated), with the following modifications. First, passivation layer 110 is omitted from semiconductor device 700. Second, due to the absence of passivation layer 110, a compliant dielectric layer is formed in semiconductor device 700 directly adjacent to silicon layer 108. For example, as shown, second compliant dielectric layer 404 has been formed on silicon layer 108. Finally, second compliant dielectric layer 404 has also been formed against liner layer 106 in the absence of passivation layer 110. The inclusion of one or more layers of compliant dielectric material (e.g., compliant dielectric sub-layers 602 including compliant dielectric layer 112, second compliant dielectric layer 404, a third compliant dielectric layer 604) may eliminate the need for passivation layer 110. The effects and benefits of omitting passivation layer 110 are described in further detail below. It should also be noted that the steps of flowchart 300 and flowchart 500 may be performed with respect to semiconductor device 700, according to embodiments.

In the embodiments described in this section, one more layers of compliant dielectric material may be applied using molding techniques, chemical vapor deposition (CVD) techniques, spin-on techniques, and/or other similar processes, as would be apparent to persons skilled in the relevant art(s) from the teachings herein.

The semiconductor devices and IC packages described herein may be formed in various ways. The following section provides example embodiments for fabricating semiconductor devices and IC packages with compliant dielectric layers.

5. Example Assembly Embodiments

Figure 8:
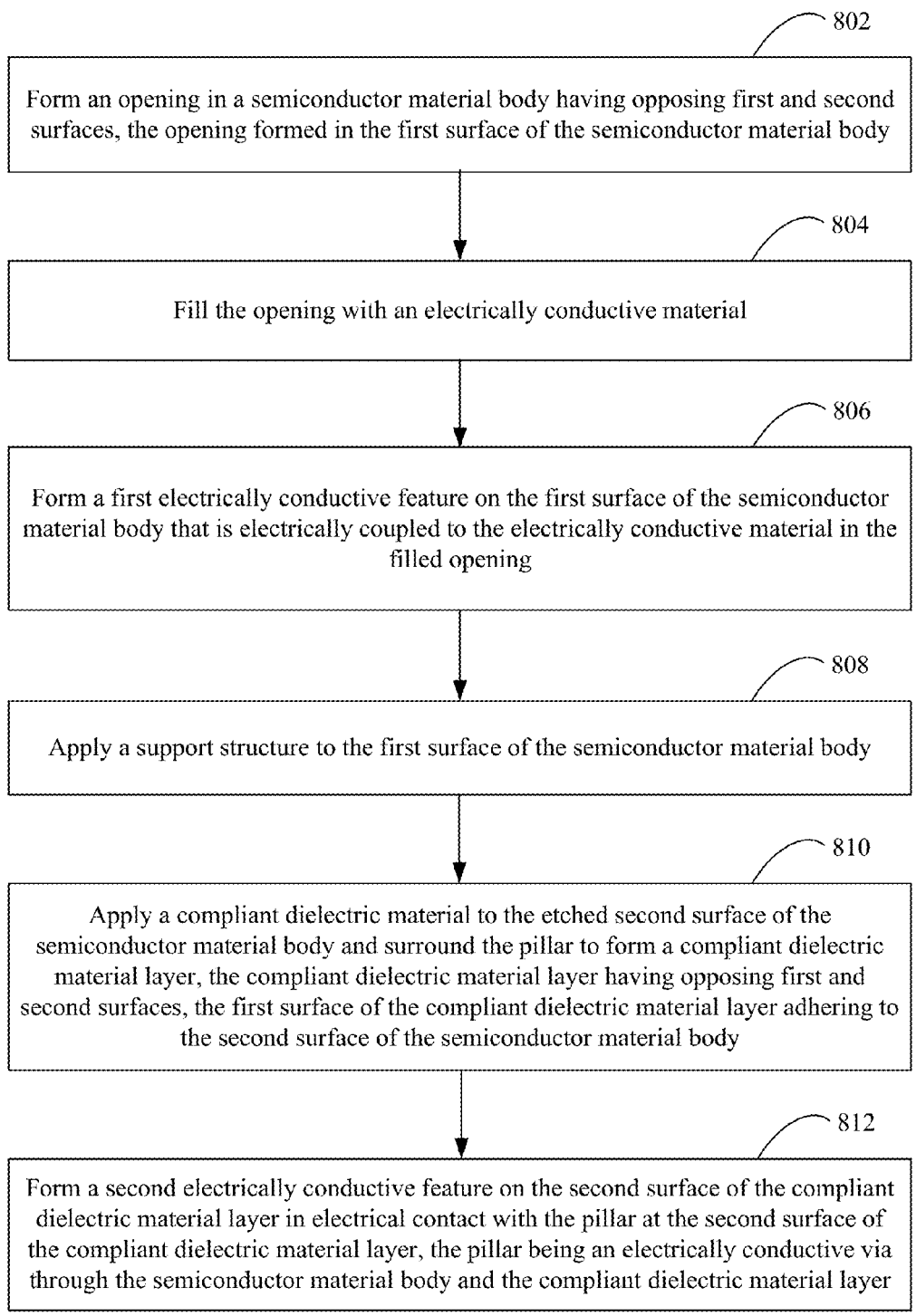
FIG. 8 is a flowchart providing example steps for assembling a semiconductor device with a compliant dielectric layer, according to an exemplary embodiment.

Semiconductor devices may be configured and assembled in various ways, according to embodiments. Turning now to FIG. 8, a flowchart providing example steps for assembling an integrated circuit (IC) package with a compliant dielectric layer is shown. Semiconductor device 100 of FIG. 1, semiconductor device 400 of FIG. 2, semiconductor device 600 of FIG. 6, semiconductor device 700 of FIG. 7, and/or any of their respective components/layers may be assembled in accordance with flowchart 800, in embodiments. Other structural and operational embodiments will be apparent to persons skilled in the relevant art(s) based on the discussion regarding flowchart 800.

The exemplary steps of flowchart 800 are described with respect to the semiconductor device shown in FIGS. 9-17, in various states of assembly. For instance, FIGS. 9-17 respectively show semiconductor device structures 900-1700 at intermediate states of assembly, while FIG. 1 shows a complete semiconductor device 100, as described above. Flowchart 800 is described as follows.

Figure 9:
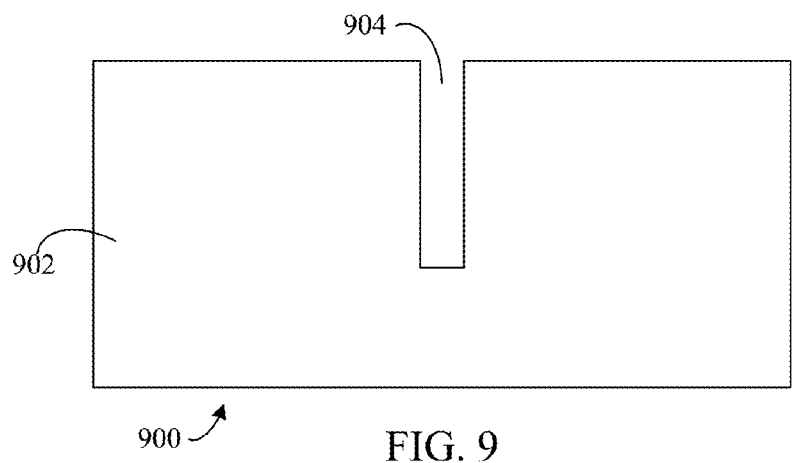
FIGS. 9-17 are cross-sectional views of portions of semiconductor devices with compliant dielectric layers in progressive states of assembly, according to exemplary embodiments.

Flowchart 800 begins with step 802. At step 802, an opening is formed in a semiconductor material body having opposing first and second surfaces, the opening formed in the first surface of the semiconductor material body. For instance, as shown in FIG. 9, semiconductor device structure 900 is depicted that includes a semiconductor material body 902 with an opening/cavity 904 formed on the first surface thereof. Opening/cavity 904 extends partially through body 902. In embodiments, the opening/cavity 904 may be made by etching, drilling, and/or other material removal processes. In an embodiment, opening/cavity 904 may have a cylindrical shape, although in other embodiments, opening/cavity 904 may have another shape.

At step 804, the opening is filled with an electrically conductive material. For example, as shown in FIG. 10, semiconductor device structure 1000 includes opening/cavity 904 filled with an electrically conductive material (e.g., copper, aluminum, tungsten, nickel, another electrically conductive metal, a combination of metals/an alloy, electrically conductive polymer, or other electrically conductive material) to form a partially-formed through silicon via 1006.

Figure 10:
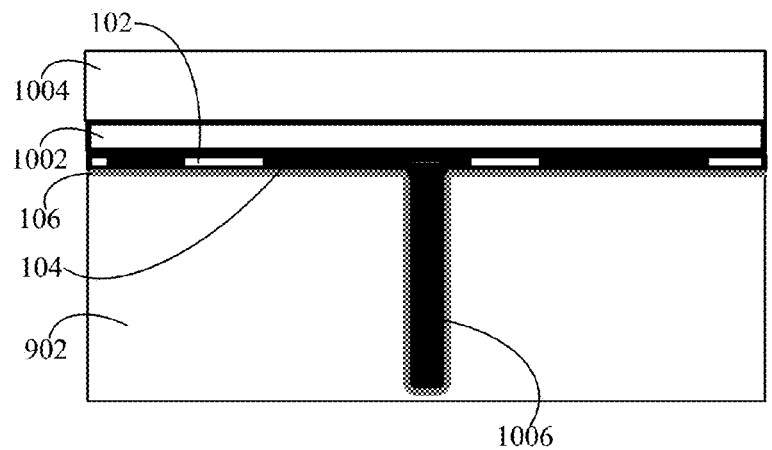
Figure 11:
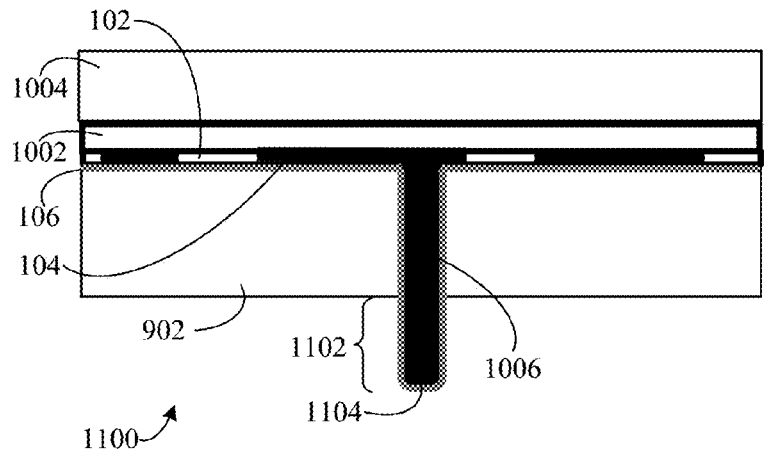

In embodiments, a via liner, e.g., liner layer 106 shown in FIG. 10, may be formed in opening/cavity 904 and on the first surface of semiconductor material body 902 prior to filling opening/cavity 904 in step 804. In embodiments, liner layer 106 may be configured as described above with respect to FIG. 1. Liner layer 106 may be formed of an electrically conductive (e.g., a metal or combination of metals/alloy, etc.) or a non-electrically conductive material (e.g., an oxide, a dielectric material, etc.)

At step 806, a first electrically conductive feature is formed on the first surface of the semiconductor material body that is electrically coupled to the electrically conductive material in the filled opening. For example, an electrically conductive material, such as first metal layer 104 shown in FIG. 10, may be formed on the first surface of semiconductor material body 902. As illustrated, a portion of first metal layer 104 (e.g., a redistribution layer) is electrically coupled with partially-formed through silicon via 1006. Accordingly, electrical signals may be passed through first metal layer 104 to partially-formed through silicon via

1006. In embodiments, first metal layer 104 may be configured as described above with respect to FIG. 1.

Additionally, a first dielectric layer, e.g., first dielectric layer 102, may be formed above semiconductor material body 902, according to embodiments. First dielectric layer 102 may be configured as described above with respect to FIG. 1.

At step 808, a support structure is applied to the first surface of the semiconductor material body. Referring again to FIG. 10, a support structure such as support structure 1004 may be applied to the first surface of semiconductor material body 902 using an adhesive layer 1002. In embodiments, support structure 1004 and adhesive layer 1002 may be bonded and configured as temporary structures and/or layers which may be subsequently removed. Support structure 1004 is configured to provide structural stability during the fabrication/assembly process flow (e.g., of flowchart 800).

In embodiments, the second surface of the semiconductor material body may be etched to expose the filled opening as a pillar extending from the second surface of the semiconductor material body. For example, turning to FIG. 11, semiconductor device structure 1100 includes a pillar 1102 having a tip surface 1104 that may be formed by etching the second surface (bottom surface in FIG. 11) of semiconductor material body 902 and exposing a portion of partially-formed through silicon via 1006. It should be noted that in embodiments, liner layer 106 may still cover the exposed portion of partially-formed through silicon via 1006 that comprises pillar 1102. In some embodiments, various types of etching, e.g., wet etching and dry etching, may be used, and in alternate embodiments, non-etching techniques may be used to expose pillar 1102.

Figure 12:
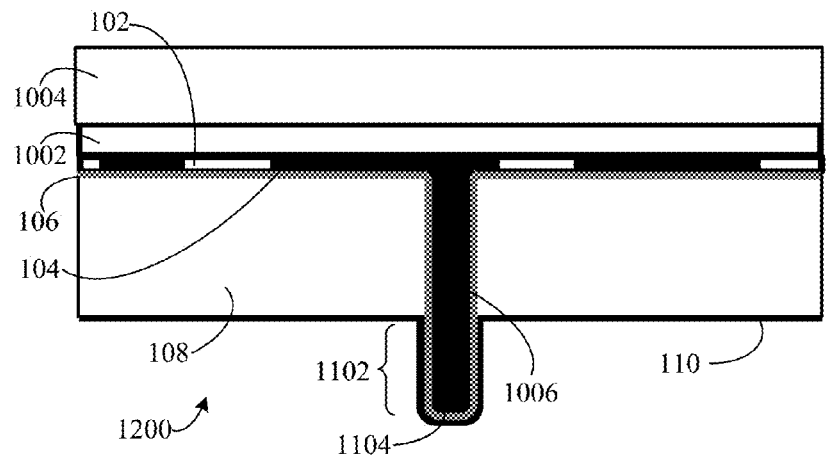

According to the etching process, semiconductor material body 902 is substantially formed into silicon layer 108, as described above with respect to FIG. 1. As shown in FIG. 12, semiconductor device structure 1200 includes silicon layer 108 in place of semiconductor material body 902.

Additionally, semiconductor device structure 1200 includes a passivation layer, e.g., passivation layer 110 as described above with respect to FIG. 1, that may be optionally formed on the etched, exposed surface of semiconductor material body 902 (i.e., at silicon layer 108) after etching. Passivation layer 110 may be formed using chemical vapor deposition (CVD) techniques, or similar processes, to deposit an oxide or nitride passivation material on the etched, exposed surface of semiconductor material body 902 (i.e., at silicon layer 108). In embodiments, when present, passivation layer 110 coats and/or surrounds pillar 1102 (over liner layer 106).

Figure 13:
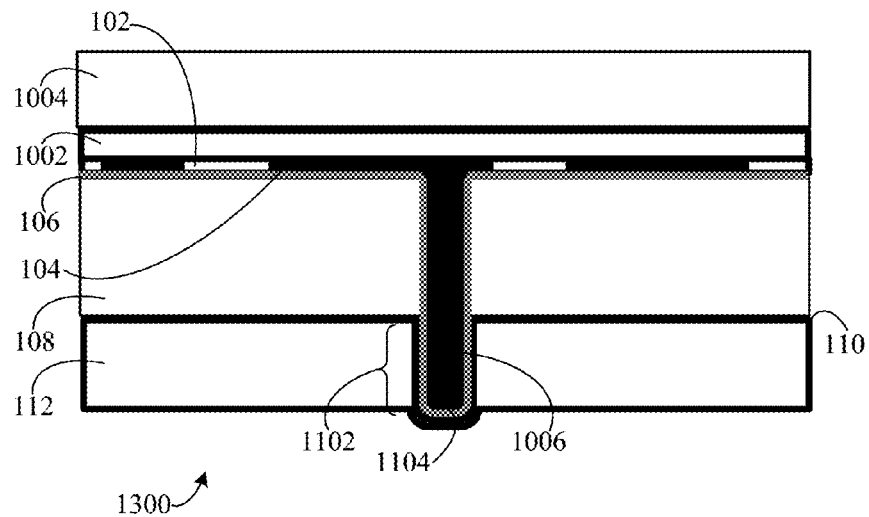

At step 810, a compliant dielectric material is applied to the etched second surface of the semiconductor material body and surrounding the pillar to form a compliant dielectric material layer, the compliant dielectric material layer having opposing first and second surfaces, the first surface of the compliant dielectric material layer adhering to the second surface of the semiconductor material body. Referring to FIG. 13, semiconductor device structure 1300 includes a compliant dielectric material that is applied to silicon layer 108 (i.e., the etched second surface of semiconductor material body 902) and surrounds pillar 1102 thus forming a compliant dielectric material layer, e.g., compliant dielectric layer 112. Compliant dielectric layer 112 has two opposing surfaces, a first surface at silicon layer 108 and a second surface at the bottom of semiconductor device structure 1300, as shown. Compliant dielectric layer 112 may be configured and/or selected similarly as described herein, and may be applied using molding techniques, CVD, a spin-on application, and/or other similar processes. In embodiments, applying compliant dielectric layer 112 to the etched second surface includes applying compliant dielectric layer 112 to passivation layer 110 such that passivation layer 110 is between silicon layer 108 (i.e., the etched semiconductor material body 902) and compliant dielectric layer 112.

In some embodiments, applying compliant dielectric layer 112 to the etched second surface includes applying multiple sub-layers of compliant dielectric material as described with respect to FIGS. 3-7 herein.

Figure 14:
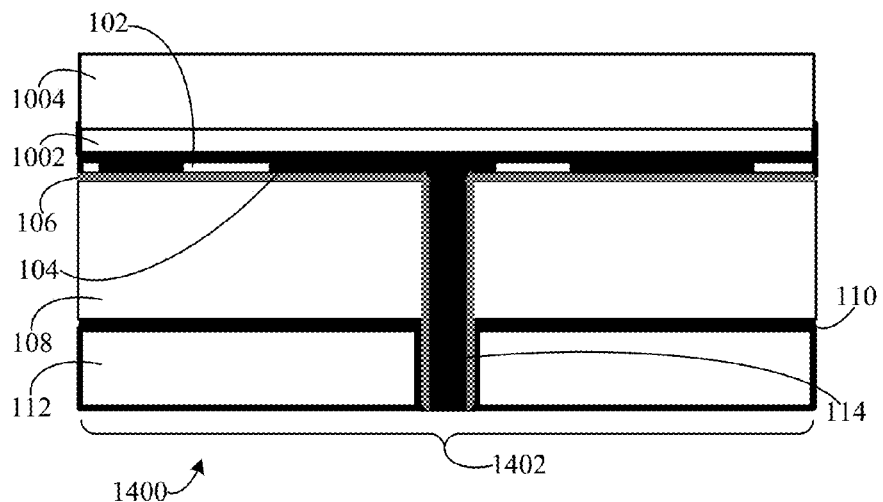

In embodiments, the bottom surface of semiconductor device structure 1300 may be planarized using a chemical mechanical polishing (CMP) technique or other similar process. For instance, FIG. 14 shows semiconductor device structure 1400 with a bottom surface 1402 that has undergone a CMP process such that bottom surface 1402 is planar or substantially planar in embodiments. Semiconductor device structure 1400 may be a further embodiment of semiconductor device structure 1300 of FIG. 13. The CMP process removes materials and/or layers covering tip surface 1104 of pillar 1102 (e.g., as passivation layer 110) such that the electrically conductive material forming pillar 1102 under tip surface 1104 becomes exposed and configured for electrically conductive connections thereto. Accordingly, through-silicon via 114 is formed.

Figure 15:
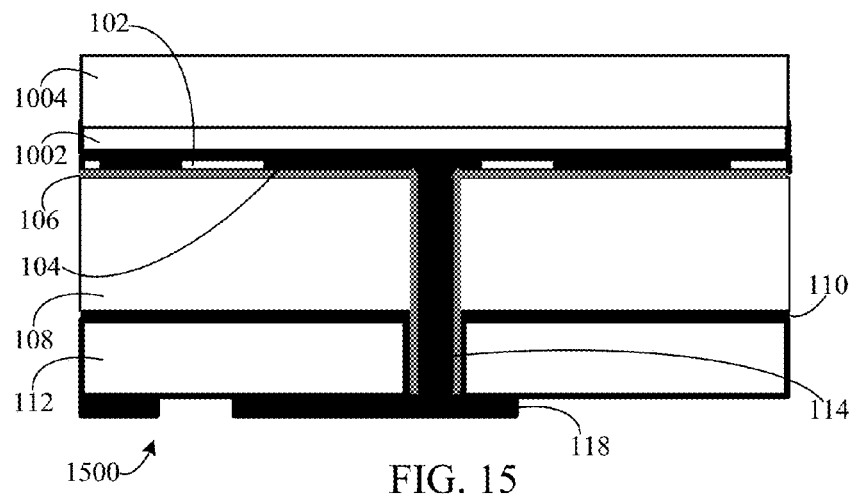

At step 812, a second electrically conductive feature is formed on the second surface of the compliant dielectric material layer in electrical contact with the pillar at the second surface of the compliant dielectric material layer, the pillar being an electrically conductive via through the semiconductor material body and the compliant dielectric material layer. For instance, FIG. 15 shows semiconductor device structure 1500 with an electrically conductive feature, e.g., a redistribution layer of second metal layer 118, formed on the second surface of compliant dielectric layer 112. Second metal layer 118 is in electrical contact with pillar 1102 (shown in FIG. 13) at the second surface of compliant dielectric layer 112. Accordingly, an electrically conductive via (i.e., through silicon via 114) through silicon layer 108 (i.e., etched semiconductor material body 902) and compliant dielectric layer 112 is completely formed providing electrical connectivity between first metal layer 104 and second metal layer 118.

Figure 16:
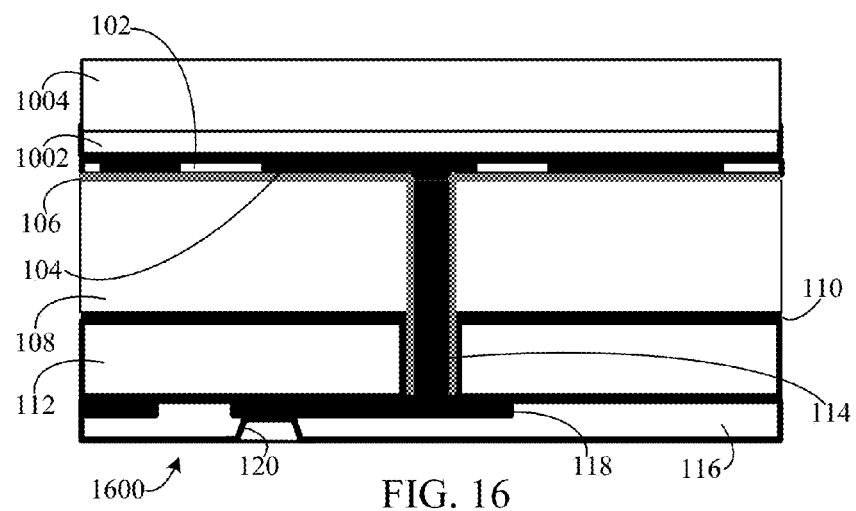
Figure 17:
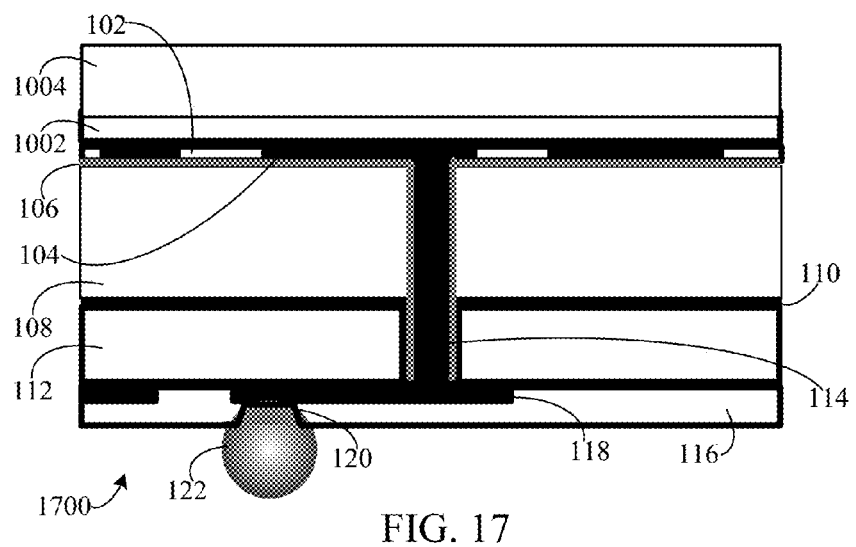

Subsequent to step 812, additional steps may also be performed. For example, FIG. 16 shows semiconductor device structure 1600 that may be a further embodiment of semiconductor device structure 1500 of FIG. 15. Semiconductor device structure 1600 includes second dielectric layer 116 and connector 120, as described above with respect to FIG. 1, which are formed at the bottom surface of semiconductor device structure 1600, as shown. Additionally, FIG. 17 shows a semiconductor device structure 1700 that may be formed subsequently from semiconductor device structure 1600 of FIG. 16. Semiconductor device structure 1700 includes solder ball/bump 122 (i.e., an interconnect member), as described above with respect to FIG. 1, which is formed at connector 120 and in electrical contact with an electrically conductive feature such as those in second metal layer 118. Solder ball/bump 122 may be formed on connector 120 in any manner, as would be known to persons skilled in the relevant art(s).

Furthermore, an additional step may be performed to remove or de-bond support structure 1004. For instance, support structure 1004 (and adhesive layer 1002) may be removed from semiconductor device structure 1700, using known techniques (e.g., peeling, delamination through heating or cooling, etc.), to substantially form semiconductor device 100 shown in FIG. 1.

In some example embodiments, one or more of steps 802, 804, 806, 808, 810, and/or 812 of flowchart 800 may not be performed. Moreover, steps in addition to or in lieu of steps 802, 804, 806, 808, 810, and/or 812 may be performed (some of which were described above). Further, in some example embodiments, one or more of steps 802, 804, 806, 808, 810, and/or 812 may be performed out of the order shown in FIG. 8, in an alternate sequence, and/or partially (or completely) concurrently with other steps.

Figure 18:
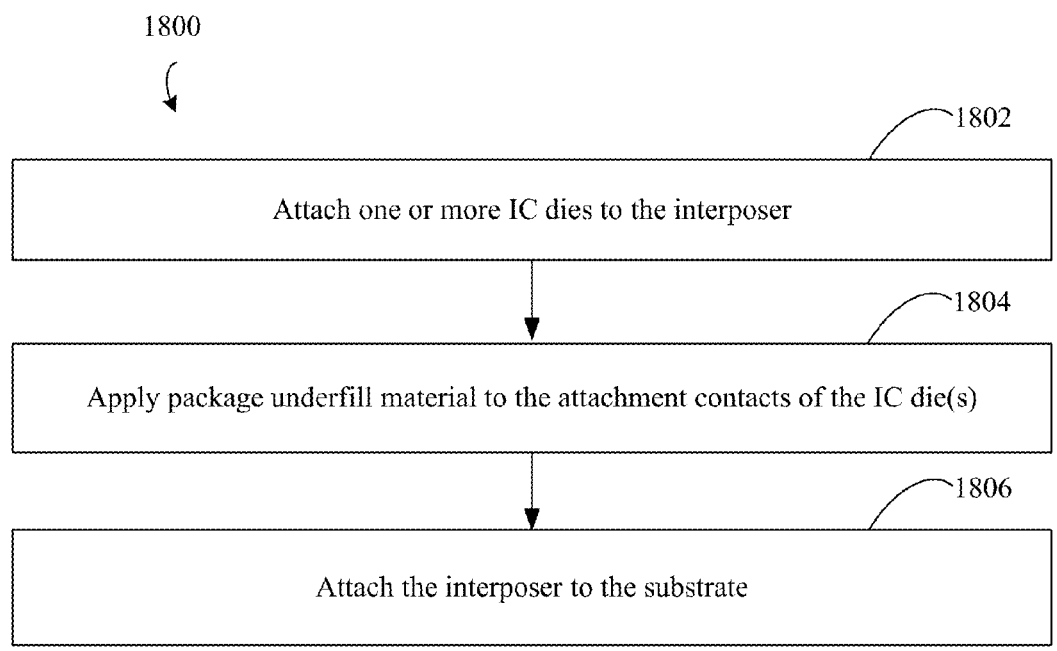
FIG. 18 is a flowchart providing example steps for assembling an IC package using an interposer with a compliant dielectric layer, according to an exemplary embodiment.

Assembled IC packages may be fabricated to include the semiconductor devices disclosed herein, such as semiconductor device 100 of FIG. 1, semiconductor device 400 of FIG. 2, semiconductor device 600 of FIG. 6, and/or semiconductor device 700 of FIG. 7. For instance, FIG. 18 shows a flowchart 1800 providing example steps for assembling IC packages with a compliant dielectric layer(s). According to flowchart 1800, IC packages may be formed that integrate semiconductor device 100 of FIG. 1, semiconductor device 400 of FIG. 2, semiconductor device 600 of FIG. 6, semiconductor device 700 of FIG. 7, and/or further semiconductor device embodiments described herein. Other structural and operational embodiments will be apparent to persons skilled in the relevant art(s) based on the discussion regarding flowchart 1800. The exemplary steps of flowchart 1800 are described as follows with respect to the IC packages shown in FIGS. 19 and 20.

Figure 19:
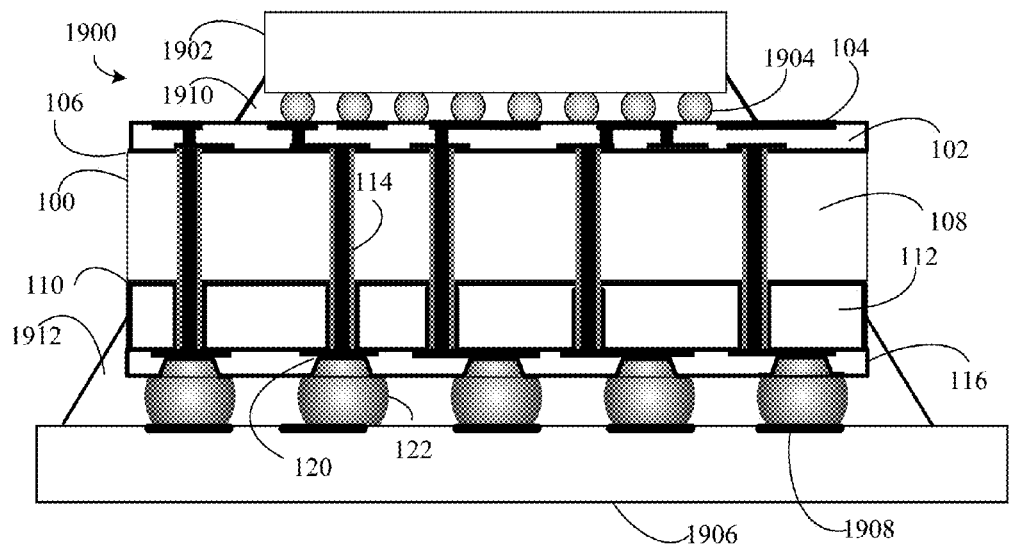
FIGS. 19-21 are cross-sectional views of portions of assembled IC packages that include semiconductor devices with compliant dielectric layers, according to an exemplary embodiment.

For instance, FIG. 19 illustrates an exemplary IC package 1900. IC package 1900 includes semiconductor device 100 of FIG. 1 (configured as an interposer) and an IC die 1902 mounted to the top surface of semiconductor device 100. In particular, as shown in FIG. 19, IC package 1900 includes first dielectric layer 102, first metal layer 104, liner layer 106, silicon layer 108, passivation layer 110, compliant dielectric layer 112, a plurality of through silicon vias 114, second dielectric layer 116, second metal layer 118, a plurality of connectors 120, and a plurality of solder balls/bumps 122.

IC package 1900 is shown mounted to a substrate 1906. IC die 1902 includes a plurality of solder balls/bumps 1904 that may be attached and electrically connected to electrically conductive features of semiconductor device 100, such as features in first metal layer 104. Substrate 1906 may be a circuit board such as an organic substrate or a printed circuit board (PCB) according to embodiments. Solder balls/bumps 122 of semiconductor device 100 may be attached and electrically connected to electrically conductive features 1908 (e.g., land pads) of substrate 1906. A first package underfill material 1910 surrounds solder balls/bumps 1904, and a second package underfill material 1912 surrounds solder balls/bumps 122 of semiconductor device 100.

Figure 20:
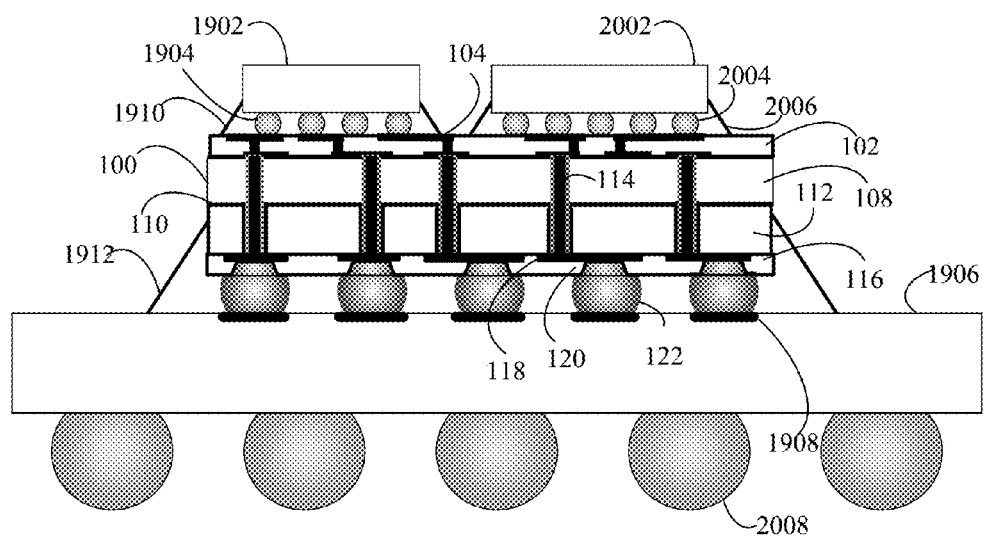

Referring to FIG. 20, an exemplary IC package 2000 is illustrated. IC package 2000 includes semiconductor device 100 of FIG. 1 (configured as an interposer), first IC die 1902 and substrate 1906 of FIG. 19, and a second IC die 2002. Thus, as shown in FIG. 20, IC package 2000 includes first dielectric layer 102, first metal layer 104, liner layer 106, silicon layer 108, passivation layer 110, compliant dielectric layer 112, a plurality of through silicon vias 114, second dielectric layer 116, second metal layer 118, a plurality of connectors 120, and a plurality of solder balls/bumps 122.

First and second IC dies 1902 and 2002 are mounted side-by-side to the top surface of semiconductor device 100 by first and second pluralities of solder balls/bumps 1904 and 2004, respectively. Solder balls/bumps 1904 and 2004 are electrically connected to electrically conductive features of semiconductor device 100 (e.g., features in first metal layer 104 shown in FIG. 1). First package underfill material 1910 surrounds solder balls/bumps 1904, second package underfill material 1912 surrounds solder balls/bumps 122, and a third package underfill material 2006 surrounds solder balls/bumps 2004. Semiconductor device 100 is shown mounted to the top surface of substrate 1906 (similarly to FIG. 19) by solder balls/bumps 122. IC package 2000 also includes a plurality of substrate solder balls/bumps 2008 attached to a bottom surface of substrate 1906 (in opposition to the top surface of substrate 1906 to which semiconductor device 100 is mounted). Solder balls/bumps 2008 enable IC package 2000 to be mounted to a subsequent circuit board.

As mentioned above, flowchart 1800 provides example steps for assembling IC packages, such as IC packages 1900 and 2000. Flowchart 1800 is described as follows.

Flowchart 1800 begins with step 1802. At step 1802, one or more IC dies are attached to an interposer. For instance, as shown in FIG. 19, IC die 1902 is positioned on semiconductor device 100. The positioning of IC die 1902 is determined based upon solder balls/bumps 1904 being aligned with electrically conductive features of semiconductor device 100, such as those in first metal layer 104 shown in FIG. 1. As shown in FIG. 20, IC die 1902 is similarly positioned above semiconductor device 100. Additionally, FIG. 20 illustrates second IC die 2002 is positioned above semiconductor device 100 based upon solder balls/bumps 2004 being aligned with electrically conductive features of semiconductor device 100.

As shown in FIG. 19, the solder balls/bumps of IC die 1902 are attached to semiconductor device 100. In embodiments, this may be accomplished using a solder reflow process or the like. A similar process may be performed to attach solder balls/bumps 1904 of IC die 1902 and solder balls/bumps 2004 of IC die 2002 to semiconductor device 100 in FIG. 20.

At step 1804, package underfill material is applied to the attachment contacts of the IC die(s). For instance, FIG. 19 shows a first package underfill material 1910 applied to surround solder balls/bumps 1904 of IC die 1902, and a second package underfill material 1912 applied to surround solder balls/bumps of semiconductor device 100 (e.g., solder balls/bump 122). In embodiments, first package underfill material 1910 and second package underfill material 1912 may comprise an epoxy and/or other non-electrically conducting materials. With respect to FIG. 20, first package under fill material 1910 is applied to surround solder balls/bumps 1904 of IC die 1902, second package under fill material 1912 is applied to surround solder balls/bumps semiconductor device 100, and a third package under fill material 2006 is applied to surround solder balls/bumps 2004 of IC die 2002. In embodiments, third package under fill material 2006 may comprise an epoxy and/or other non-electrically conducting materials.

At step 1806, the interposer is attached to the substrate. For instance, as shown in FIG. 19, semiconductor device 100, configured as an interposer, is positioned on substrate 1906. The positioning of semiconductor device 100 is determined based the positions of solder balls/bumps 122, to be aligned with electrically conductive features 1908 of substrate 1906. As shown in FIG. 20, semiconductor device 100 is similarly positioned above substrate 1906.

As shown in FIG. 19, the solder balls/bumps of semiconductor device 100 (e.g., instances of solder ball/bump 122) are attached to substrate 1906. In embodiments, this may be accomplished using a solder reflow process or the like. A similar process may be performed to attach the solder balls/bumps of semiconductor device 100 (e.g., instances of solder ball/bump 122) to substrate 1906 of FIG. 20.

It should be noted that during processes, such as solder reflow, in which heating and cooling of components takes place, the addition of a compliant dielectric layer (e.g., compliant dielectric layer 112) allows for mechanical and thermal variance with a decrease in stress and damage to components, as described herein.

In some example embodiments, one or more steps 1802, 1804, and/or 1806 of flowchart 1800 may not be performed. Moreover, steps in addition to or in lieu of steps 1802, 1804, and/or 1806 may be performed. Further, in some example embodiments, one or more of steps 1802, 1804, and/or 1806 may be performed out of order, in an alternate sequence, and/or partially (or completely) concurrently with other steps.

Figure 21:
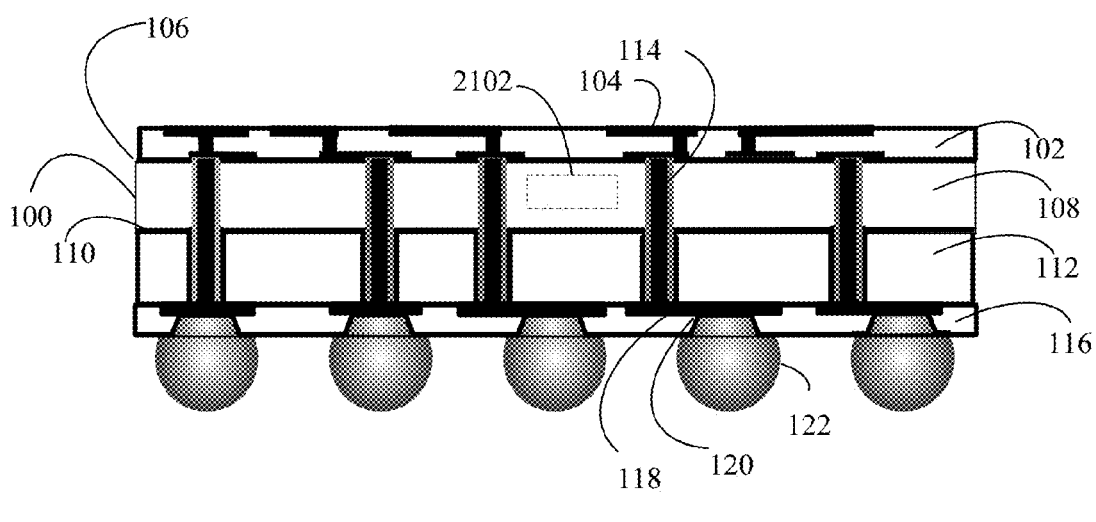

FIG. 21 illustrates another exemplary IC package 2100, according to an embodiment. IC package 2100 includes semiconductor device 100 configured as an integrated circuit die. In particular, as shown in FIG. 21, IC package 2100 includes first dielectric layer 102, first metal layer 104, liner layer 106, silicon layer 108, passivation layer 110, compliant dielectric layer 112, a plurality of through silicon vias 114, second dielectric layer 116, second metal layer 118, a plurality of connectors 120, and a plurality of solder balls/bumps 122. Solder balls/bumps 122 may be attached and electrically connected to electrically conductive features (e.g., land pads) of a circuit board.

Furthermore, as shown in FIG. 21, silicon layer 108 includes an active integrated circuit region 2102 that includes integrated circuitry that provides electrical circuit functionality to IC package 2100 itself In such a configuration, IC package 2100 may be considered to be a wafer-level integrated circuit package (e.g., a wafer-level ball grid array package—WLBGA). Active integrated circuit region 2102 may be formed on the top surface of silicon layer 108 shown in FIG. 21, and may be formed by any suitable integrated circuit fabrication process, including by photolithography or other integrated circuit fabrication process. Signals of active integrated circuit region 2102 may be accessible at terminals on a top surface of silicon layer 108 in FIG. 21.

In an embodiment, routing in metal layer 104 may be used to electrically couple the terminals on the top surface of silicon layer 108 (through vias through first dielectric layer 102) to through silicon vias 114. Through silicon vias 114 route signals of the terminals through silicon layer 108 and compliant dielectric layer 112 to be electrically coupled to solder balls/bumps 122 at connectors 120 on the bottom surface of IC package 2100 in FIG. 21.

6. Further Example Embodiments and Advantages for IC Packages Including Compliant Dielectric Layers The embodiments described herein provide for improved integrated circuit (IC) packages. The embodiments herein provide semiconductor devices and IC packages that include one or more compliant dielectric layers. The compliant dielectric layer(s) may be selected so that the coefficient of thermal expansion (CTE) of the compliant dielectric layer(s) matches or approximately matches the CTE of the substrate upon which the IC package is mounted. Compliant dielectric material layer(s) may be selected that have a deformability that is greater than a deformability of the semiconductor material body of the IC die or interposer to which they are attached. This allows for flexibility with respect to mechanical stresses that occur during processes and operations that involve heating and cooling of the IC package. In other words, allowing a portion of an IC package to expand and contract similarly to the substrate on which it rests reduces stress in the device and reduces damage to parts. Electrical capacitance may also be reduced through the use of compliant dielectric layers, and improved backside metallization is also achieved on organic, compliant dielectric layers.

An additional benefit to IC packages that include one or more compliant dielectric layers is that such packages may be created at greater scale than the current state of the art. For instance, in wafer level ball grid array (WLBGA) packages, a flip chip interposer, such as those described in embodiments herein, allows for a 200%-400% increase in interposer area over the current state of the art (e.g., approx. 600 mm$^2$)

Similarly, larger IC die may be mounted on substrates that include thick organic, compliant dielectric layers. Using a through silicon via substrate, a high density top-pad interconnect can be achieved for flip chip IC die while maintaining CTE matching with a printed circuit board. For example, the size of an IC package can be increased to 256 mm$^2$ (16 mm×16 mm) with a 0.4 mm ball pitch due to the stress buffering provided by the compliant dielectric layers. In some cases, WLBGA pitch may be decreased to approximately 0.3 mm.

As described in embodiments above, the use of compliant dielectric layers can eliminate the need for passivation layers in IC packages as the thick organic, compliant dielectric materials can be sufficient to prevent backside metal diffusion into silicon layers. This results in cost savings for materials and assembly processes, and also reduces capacitance due to the passivation layer properties (high k) which in turn reduces signal propagation delay and power consumption.

The described embodiments may be applicable across a wide range of technologies and products that IC packages such as, but not limited to, communication systems, communication devices, computing devices, electronic devices, and/or the like.

It will be recognized that the IC packages, their respective components, and/or the techniques described herein may be implemented in hardware, software, firmware, or any combination thereof, and/or may be implemented as hardware logic/electrical circuitry. The disclosed technologies can be put into practice using software, firmware, and/or hardware implementations other than those described herein. Any software, firmware, and hardware implementations suitable for performing the functions described herein can be used, such as those described below.

7. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in

What is claimed is:

1. An integrated circuit (IC) package, comprising:
   a semiconductor material body having opposing first and second surfaces, and including a first electrically conductive feature at the first surface;
   a compliant dielectric material layer having opposing first and second surfaces, the first surface of the compliant dielectric material layer on the second surface of the semiconductor material body, the compliant dielectric material layer having a deformability that is greater than a deformability of the semiconductor material body;
a second electrically conductive feature formed on the second surface of the compliant dielectric material layer;
an electrically conductive via formed through the semiconductor material body and the compliant dielectric material layer that electrically couples the first electrically conductive feature to the second electrically conductive feature;
a passivation layer between the compliant dielectric material layer and the semiconductor material body, and between the compliant dielectric material layer and the electrically conductive via, the electrically conductive via within the semiconductor material body lacking the passivation layer; and
an interconnect member coupled to the second surface of the compliant dielectric material layer in electrical contact with the second electrically conductive feature.

2. The IC package of claim wherein the semiconductor material body includes an active integrated circuit.

3. The IC package of claim 1, wherein the semiconductor material body is configured as an interposer for the IC package, and the IC package further comprises:
an IC die mounted to the first surface of the interposer.

4. The IC package of claim 1,
wherein the electrically conductive via is not coated by the passivation layer at the second surface of the compliant dielectric material layer.

5. The IC package of claim I, wherein the compliant dielectric material layer comprises:
a plurality of compliant dielectric material sub-layers.

6. The IC package of claim 5, wherein at least two of the compliant dielectric material sub-layers comprise different dielectric materials front each other.

7. The IC package of claim 1, wherein the IC package is configured to be attached to a circuit board using the interconnect member, and
wherein the compliant dielectric material layer has a coefficient of thermal expansion that is approximately the same as the circuit board.

8. An integrated circuit (IC) package, comprising:
an interposer having opposing first and second surfaces, that comprises:
a semiconductor material body having opposing first and second surfaces;
a compliant dielectric material layer having opposing first and second surfaces, the first surface of the compliant dielectric material layer on the second surface of the semiconductor material body, the compliant dielectric material layer having a deformability that is greater than a deformability of the semiconductor material body, the compliant dielectric material layer comprising a plurality of compliant dielectric material sub-layers;
a first electrically conductive via and a second electrically conductive via each formed through the semiconductor material body and the compliant dielectric material layer; and
at least one IC die mounted to the first surface of the interposer.

9. The IC package of claim 8, further comprising:
a first electrically conductive feature formed on the first surface of the semiconductor material body;
a second electrically conductive feature formed on the first surface of the semiconductor material body;
a third electrically conductive feature formed on the second surface of the compliant dielectric material layer;
a fourth electrically conductive feature formed on the second surface of the compliant dielectric material layer;
a first interconnect member coupled to the first surface of the compliant dielectric material layer and in electrical contact with the first electrically conductive feature;
a second interconnect member coupled to the first surface of the compliant dielectric material layer and in electrical contact with the second electrically conductive feature;
a third interconnect member coupled to the second surface of the compliant dielectric material layer and in electrical contact with the third electrically conductive feature; and
a fourth interconnect member coupled to the second surface of the compliant dielectric material layer and in electrical contact with the fourth electrically conductive feature.

10. The IC package of claim 9, wherein the first electrically conductive via electrically couples the first electrically conductive feature to the third electrically conductive feature, and
wherein the second electrically conductive via electrically couples the second electrically conductive feature to the fourth electrically conductive feature.

11. The IC package of claim 10, wherein a first IC die is coupled to the first interconnect member and a second IC die is coupled to the second interconnect member, and
wherein the third interconnect member and the fourth interconnect member are each coupled to a circuit board.

12. The IC package of claim 11, wherein the compliant dielectric material has a coefficient of thermal expansion property that is approximately equal to a coefficient of thermal expansion property of the circuit board.

13. The IC package of claim 12, wherein the first surface of the interposer has an area of at least 625 mm$^2$.

14. A semiconductor device, comprising:
a semiconductor material body having opposing first and second surfaces;
a compliant dielectric material layer having opposing first and second surfaces, the first surface of the compliant dielectric material layer on the second surface of the semiconductor material body, the compliant dielectric material layer having a deformability that is greater than a deformability of the semiconductor material body the compliant dielectric material layer comprising a plurality of compliant dielectric material sub-layers;
an electrically conductive via passing through the semiconductor material body and the compliant dielectric material layer and in electrical contact with a metal layer on the first surface of the semiconductor material body, a first sub-layer of the plurality of compliant dielectric material sub-layers being between the electrically conductive via and a second sub-layer of the plurality of compliant dielectric material sub-layers; and
an interconnect member coupled to the second surface of the compliant dielectric material layer in electrical contact with the electrically conductive via.

15. The semiconductor device of claim 14, wherein the semiconductor material body includes an active integrated circuit (IC).

16. The semiconductor device of claim 15, wherein the semiconductor material body is configured as an interposer for an IC package, and the first surface of the interposer comprises a plurality of electrically conductive features configured to mount an IC die.

17. The semiconductor device of claim 14, wherein the semiconductor material body is configured as an interposer for an integrated circuit (IC) package, and the first surface of the interposer comprises a plurality of electrically conductive features configured to mount an IC die.

18. The semiconductor device of claim 14, further comprising:
   a passivation layer between the compliant dielectric material layer and the semiconductor material body, and between the compliant dielectric material layer and the electrically conductive via, the electrically conductive via not coated by the passivation layer at the second surface of the compliant dielectric material layer.

19. The semiconductor device of claim 14,
   wherein at least two of the compliant dielectric material sub-layers comprise different dielectric materials from each other.

20. The semiconductor device of claim 14, wherein the semiconductor device comprises at least one interconnect member configured to attach the semiconductor device to a circuit board, and
   wherein the compliant dielectric material layer has a coefficient of thermal expansion that is approximately the same as the circuit board.

* * * * *